(12) United States Patent
van Holland et al.

(10) Patent No.: US 9,571,038 B1
(45) Date of Patent: Feb. 14, 2017

(54) DRIVER CIRCUIT FOR A POWER STAGE OF A CLASS-D AMPLIFIER

(71) Applicants: Gertjan van Holland, Ede (NL); Patrick John Zeelen, Wijchen (NL); Jacobus Govert Sneep, Bavel (NL)

(72) Inventors: Gertjan van Holland, Ede (NL); Patrick John Zeelen, Wijchen (NL); Jacobus Govert Sneep, Bavel (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/840,303

(22) Filed: Aug. 31, 2015

(51) Int. Cl.
  *H03F 3/217* (2006.01)
  *H03F 1/02* (2006.01)
  *H03F 3/185* (2006.01)
  *H03F 3/21* (2006.01)

(52) U.S. Cl.
  CPC ............ *H03F 1/0211* (2013.01); *H03F 3/185* (2013.01); *H03F 3/211* (2013.01); *H03F 3/2171* (2013.01); *H03F 2200/03* (2013.01); *H03F 2203/21109* (2013.01)

(58) Field of Classification Search
  CPC ............................. H03F 3/217; H03F 3/2171
  USPC ...................... 330/10, 207 A, 251
  See application file for complete search history.

(56) References Cited

U.S. PATENT DOCUMENTS 5,798,672 A * 8/1998 Masini ................ H03K 3/2821
                                                                    330/10

OTHER PUBLICATIONS

M Berkhout, "An Integrated 200-W Class-D Audio Amplifier", IEEE journal of solid-state circuits, vol. 38, No. 7, Jul. 2003.
M Berkhout, et al, Audio at Low and High Power, Solid-State Circuits Conference, 34th European, 2008.
H Ma, et al, "Design and Analysis of High-Efficiency High-Voltage Class-D Power output Stage", IEEE Journal of solid-state circuits, vol. 49, No. 7, Jul. 2014.

* cited by examiner

*Primary Examiner* — Steven J Mottola

(57) ABSTRACT

Embodiments of a driver circuit for a power stage of a class-D amplifier and a class-D amplifier are described. In one embodiment, a driver circuit for a power stage of a class-D amplifier includes serially connected transistor devices connected to a gate terminal of a power transistor of the power stage of the class-D amplifier, a voltage generator connected between a gate terminal of a first transistor device of the serially connected transistor devices and a source terminal of the power transistor, and a current multiplier connected between the gate terminal of the power transistor and one of a source terminal and a drain terminal of the first transistor device. The current multiplier is configured to produce an output current that is proportional to a current at the one of the source terminal and the drain terminal of the first transistor device.

17 Claims, 6 Drawing Sheets

DRIVER CIRCUIT FOR A POWER STAGE OF A CLASS-D AMPLIFIER

BACKGROUND

Class-D amplifiers can be used in consumer and automotive devices to achieve good signal quality, high output power, high efficiency and long-term battery life for mobile or automotive applications. For example, class-D amplifiers can be used in personal computing devices such as mobile phones, hearing aids, and audio systems such as home theatre systems, power speakers, subwoofers, and bass amplifiers.

A class-D amplifier typically includes a driver device to generate a driving signal for power transistors in the power stage of the class-D amplifier. Conventional driver devices for power stages of class-D amplifiers generally require bootstrap capacitors or a charge pump voltage for producing a reference voltage. In addition, conventional driver devices for power stages of class-D amplifiers typically have stringent capacitance requirement for transistors in driver devices. Consequently, the component cost of a conventional driver device can be substantially high.

SUMMARY

Embodiments of a driver circuit for a power stage of a class-D amplifier and a class-D amplifier are described. In one embodiment, a driver circuit for a power stage of a class-D amplifier includes serially connected transistor devices connected to a gate terminal of a power transistor of the power stage of the class-D amplifier, a voltage generator connected between a gate terminal of a first transistor device of the serially connected transistor devices and a source terminal of the power transistor, and a current multiplier connected between the gate terminal of the power transistor and one of a source terminal and a drain terminal of the first transistor device. The current multiplier is configured to produce an output current that is proportional to a current at the one of the source terminal and the drain terminal of the first transistor device. Because the current multiplier can produce a larger output current for the power transistor, the capacitance requirement for the serially connected transistor devices can be relaxed and the component cost of the driver device can be reduced.

In an embodiment, a ratio between the output current of the current multiplier and the current at the one of the source terminal and the drain terminal of the first transistor device is a value that is larger than 1.

In an embodiment, the current multiplier includes multiple current mirrors.

In an embodiment, the serially connected transistor devices further include a second transistor device with one of a source terminal or a drain terminal connected to the gate terminal of the power transistor.

In an embodiment, the serially connected transistor devices further include a third transistor device connected between the gate terminal of the power transistor and the source terminal of the power transistor. In an embodiment, gate terminals of the second and third transistor devices are connected to each other. In an embodiment, the second and third transistor devices are transistors of different types.

In an embodiment, the driver circuit further includes a first current source connected to the current multiplier and to the one of the source terminal and the drain terminal of the first transistor device.

In an embodiment, the driver circuit further includes a second current source connected to the current multiplier and a fourth transistor device with a gate terminal connected to a gate terminal of the first transistor device and to the second current source.

In an embodiment, the driver circuit further includes a fifth transistor device serially connected to the fourth transistor device, a resistor serially connected to the fifth transistor device, a sixth transistor device connected to a gate terminal of the fifth transistor device and to the source terminal of the power transistor, and a seventh transistor device connected to the resistor device and to the source terminal of the power transistor.

In an embodiment, the power transistor is an NMOS transistor, and the source terminal of the power transistor is a source terminal of the NMOS transistor.

In an embodiment, the first transistor device is an NMOS transistor, and the one of the source terminal and the drain terminal of the first transistor device is a drain terminal of the NMOS transistor.

In an embodiment, a class-D amplifier includes the driver circuit and the power stage. In an embodiment, the class-D amplifier further includes a modulator configured to convert an input signal into a modulated signal for the power stage.

In an embodiment, a driver circuit for a power stage of a class-D amplifier includes serially connected transistor devices connected to a gate terminal of an NMOS power transistor of the power stage, a voltage generator connected between a gate terminal of a first NMOS transistor device of the serially connected transistor devices and a source terminal of the NMOS power transistor, and a current multiplier connected between the gate terminal of the NMOS power transistor and a drain terminal of the first NMOS transistor device. The current multiplier is configured to produce an output current that is proportional to a current at the drain terminal of the first NMOS transistor device.

In an embodiment, a ratio between the output current of the current multiplier and the current at the one of the source terminal and the drain terminal of the first transistor device is a value that is larger than 1.

In an embodiment, the current multiplier includes multiple current mirrors.

In an embodiment, the serially connected transistor devices further include a PMOS transistor device with a drain terminal connected to the gate terminal of the NMOS power transistor and a second NMOS transistor device, where the drain terminals of the PMOS transistor device and the second NMOS transistor devices are connected to the gate terminal of the NMOS power transistor.

In an embodiment, a class-D amplifier includes a modulator configured to convert an input signal into a modulated signal and a power stage configured to amplify the modulated signal to generate an amplified signal for driving a load. The power stage includes a first driver circuit, a first power transistor operably connected to the first driver circuit, a second driver circuit, and a second power transistor operably connected to the second driver circuit. The first driver circuit includes serially connected transistor devices connected to a gate terminal of the first power transistor of the power stage, a voltage generator connected between a gate terminal of a first transistor device of the serially connected transistor devices and a source terminal of the first power transistor, and a current multiplier connected between the gate terminal of the first power transistor and one of a source terminal and a drain terminal of the first transistor device. The current multiplier is configured to produce an output current that is proportional to a current at the one of the source terminal and the drain terminal of the first transistor device.

In an embodiment, the serially connected transistor devices further include a second transistor device with one of a source terminal or a drain terminal connected to the gate terminal of the first power transistor.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
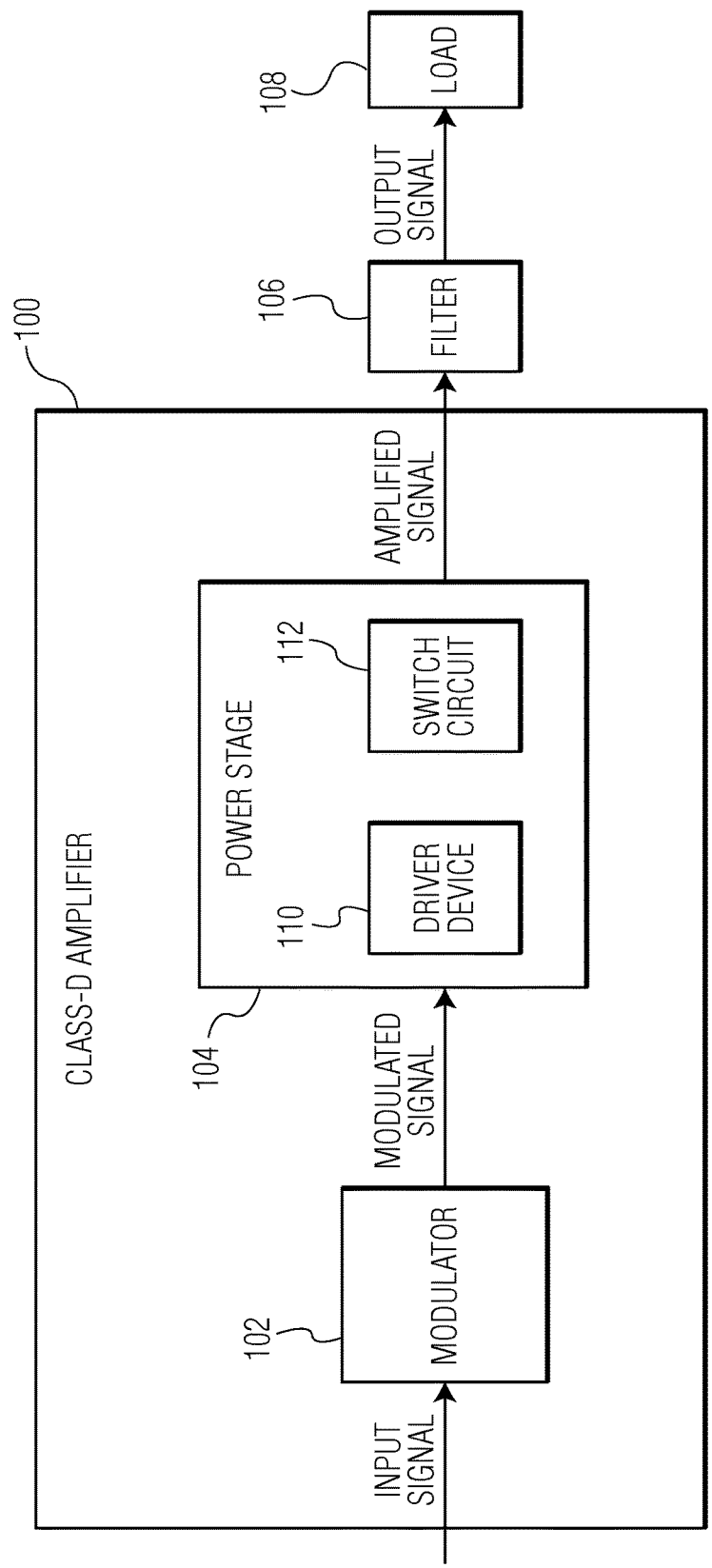
FIG. 1 is a schematic block diagram of a class-D amplifier.

FIG. 1 is a schematic block diagram of a class-D amplifier 100. In the embodiment depicted in FIG. 1, the class-D amplifier includes a modulator 102 and a power stage 104. The class-D amplifier is typically provided as an Integrated Circuit (IC) device. The class-D amplifier can amplify an input signal to generate an output signal, which is used to drive a load 108. For example, the class-D amplifier amplifies an audio input signal to generate an audio output signal with higher power to drive a speaker. In some embodiments, the class-D amplifier is used in in-vehicle audio systems, speakers, ear buds, headphones or mobile devices. The class-D amplifier 100 uses nonlinear amplification that involves switching of the output between discrete voltage levels. Compared to linear amplifiers such as class-A, class-AB or class-B amplifiers, the class-D amplifier has less power dissipation and higher power efficiency. For example, the class-D amplifier may have a power efficiency of over 90% while a class-AB amplifier has a maximum efficiency of 78.5% for a sine wave and about 25% for music signals.

The modulator 102 of the class-D amplifier 100 is configured to modulate an input signal to generate a modulated signal. In some embodiments, the modulator is configured to convert an analog input signal into a series of pulses by pulse width modulation (PWM), pulse density modulation or other pulse modulation techniques. In an embodiment, the modulator converts the input signal into a PWM signal that is used to drive the power stage 104.

The power stage 104 of the class-D amplifier 100 is configured to amplify the modulated signal from the modulator 102 to generate an amplified signal. The power stage includes a driver device 110 configured to generate one or more drive signals based on the modulated signal from the modulator and a switch circuit 112 configured to be switched based on the drive signals to generate the amplified signal.

Figure 2:
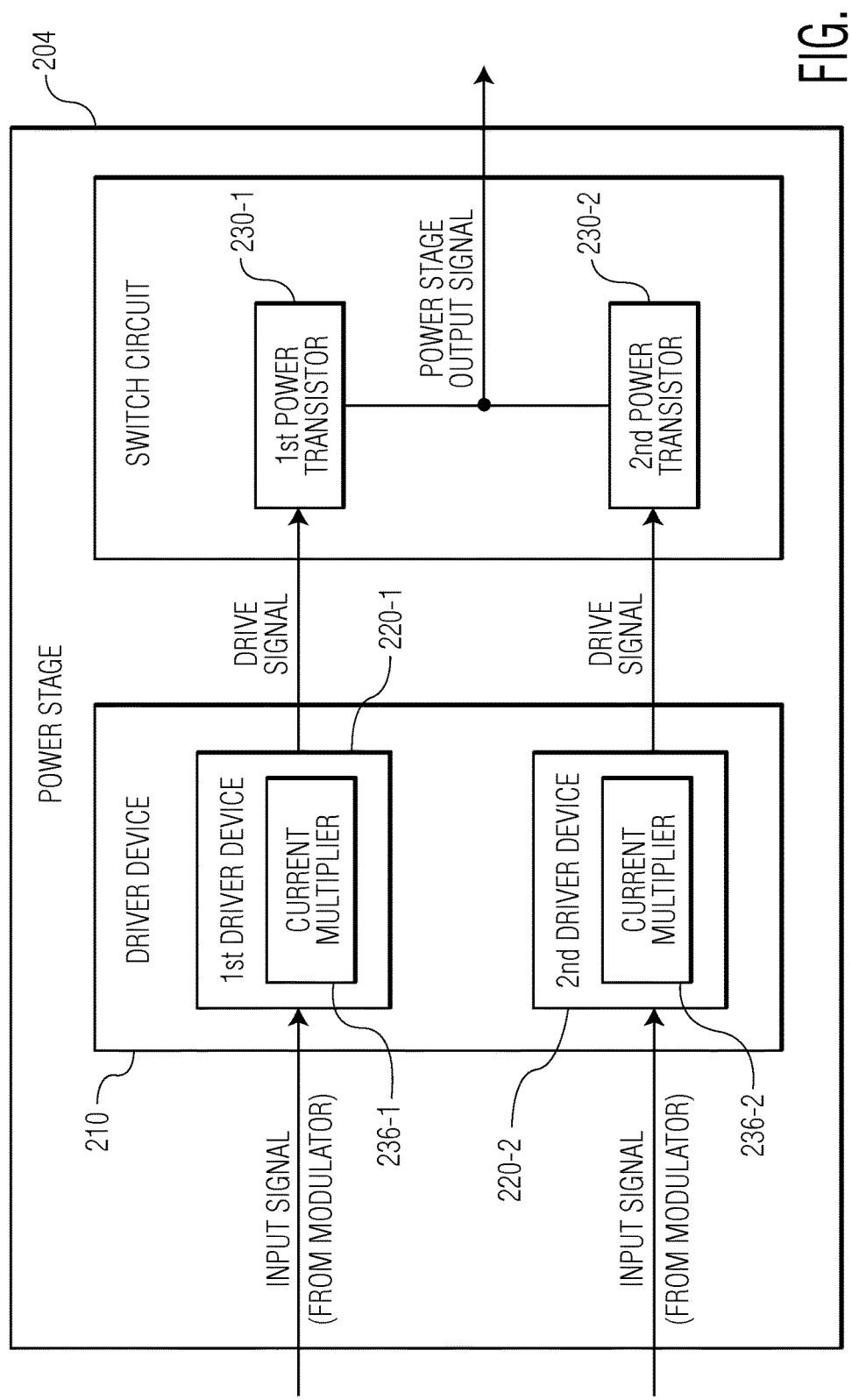
FIG. 2 depicts an embodiment of a power stage of the class-D amplifier 100 depicted in FIG. 1.

FIG. 2 depicts an embodiment of the power stage 104 of the class-D amplifier 100 depicted in FIG. 1. In the embodiment depicted in FIG. 2, a power stage 204 includes a driver device 210 configured to generate drive signals based on one or more input signals from the modulator 102 (shown in FIG. 1) and a switch circuit 212 configured to operate based on the drive signals to generate a power stage output signal. The driver device includes a first driver circuit 220-1 and a second driver circuit 220-2 and the switch circuit includes a first power transistor 230-1 and a second power transistor 230-2. The first driver circuit is configured to generate a drive signal for the first power transistor. The second driver circuit is configured to generate a drive signal for the second power transistor. Based on the drive signals from the first and second driver circuits, the first and second power transistors generate the power stage output signal.

Turning back to FIG. 1, a filter 106, which is typically not in the same IC device as the class-D amplifier 100 (i.e., separated from the class-D amplifier), is used to filter the amplified signal from the power stage 104 to generate an output signal to drive the load 108. The low frequency content of the amplified signal represents the desired output signal of the class-D amplifier. In these embodiments, the filter is implemented as a low-pass filter to reconstruct the desired output signal. The low-pass filter may be a low-loss second or higher order inductor-capacitor LC filter.

Figure 3:
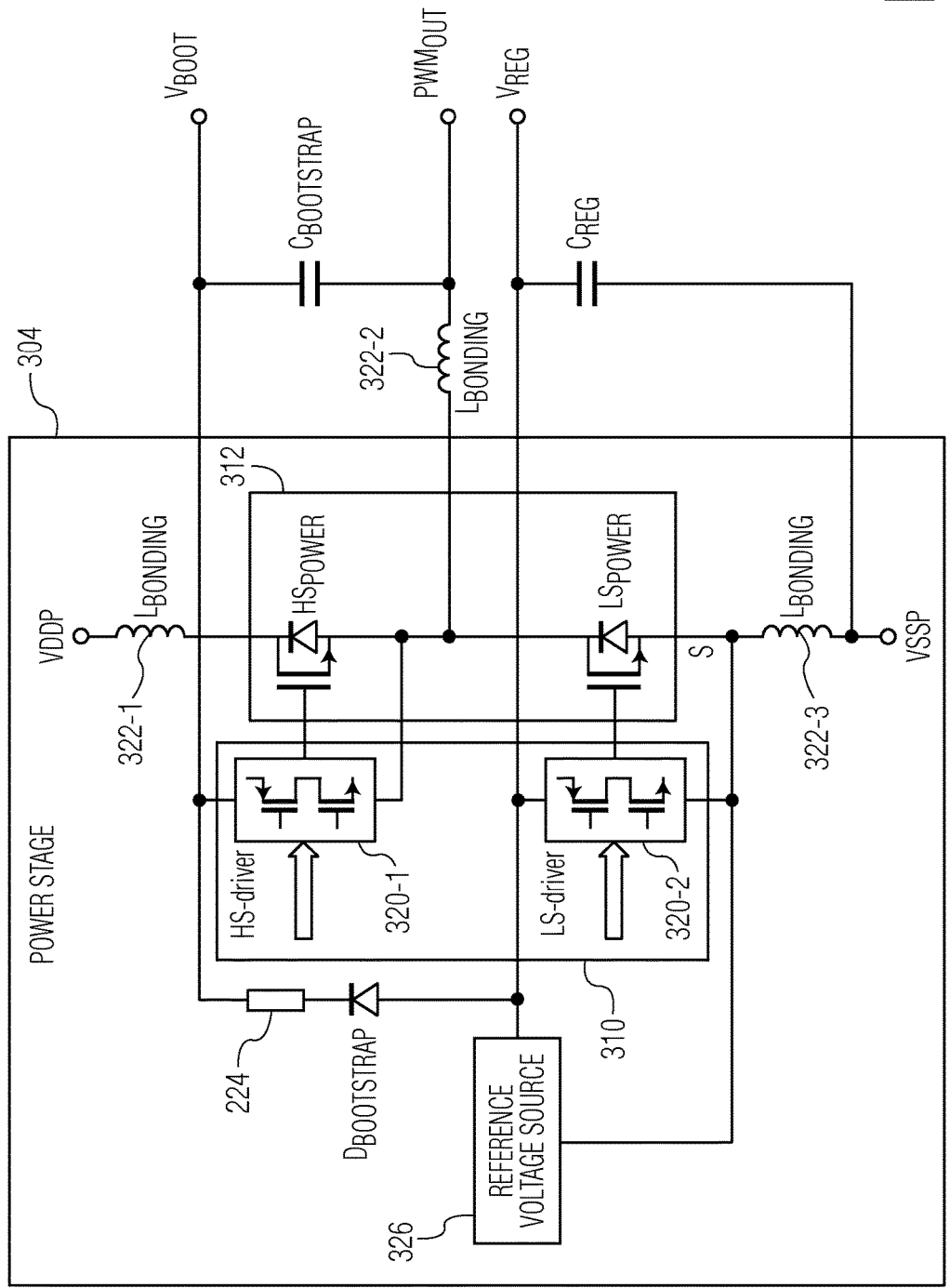
FIG. 3 depicts a typical NMOS-NMOS power stage of a class-D amplifier that creates a reference voltage using external capacitors.

In a class-D amplifier with an NMOS-NMOS power stage, a reference voltage higher than the supply voltage of the NMOS-NMOS power stage is needed for switching the NMOS-NMOS power stage. FIG. 3 depicts a typical NMOS-NMOS power stage 304 of a class-D amplifier that creates such a reference voltage using external bootstrap capacitors. As shown in FIG. 3, the power stage includes a driver device 310 that includes a high-side driver circuit 320-1 and a low-side driver circuit 320-2, a switch circuit 312 that includes power transistors, "$HS_{POWER}$," "$LS_{POWER}$," two inductors, "$L_{BONDING}$," 322-1, 322-3, a resistor 324, and a reference voltage source 326. Capacitors, "$C_{BOOTSTRAP}$," "$C_{REG}$," a diode, "$D_{BOOTSTRAP}$," and an inductor, $L_{BONDING}$, 322-2 are located external to the power stage. When the power transistor, $LS_{POWER}$, is turned on, the output signal, $PWM_{OUT}$, of the power stage is low and the bootstrap capacitor, $C_{BOOTSTRAP}$, is charged by the reference voltage source. When the amplifier output, $PWM_{OUT}$, is high, the voltage between the voltage, $V_{BOOT}$, and the output signal, $PWM_{OUT}$, is large enough to drive the high-side power transistor, $HS_{POWER}$. The charge currents for the gate-source capacitor ($C_{GS}$) and the gate-drain capacitor ($C_{GD}$) of the high-side power transistor, $HS_{POWER}$, are supplied by the bootstrap capacitor, $C_{BOOTSTRAP}$. The charge currents for the low-side power transistor, $LS_{POWER}$, are supplied by the reference voltage source, which is bandwidth limited. The charge currents needed in the power transistor are transient currents, and consequently, can cause the reference voltage of the reference voltage source to dip. The capacitor, $C_{REG}$, delivers the current spikes needed to charge of the gate-source capacitor ($C_{GS}$) and the gate-drain capacitor ($C_{GD}$) of the low-side power transistor, $LS_{POWER}$. In the power stage shown in FIG. 3, the gate-source voltage ($V_{Gs}$) and the driver voltage of the low-side power transistor, $LS_{POWER}$, can become high when the class-D amplifier switches large currents because the capacitor, $C_{REG}$, is connected to the source terminal, "S," of the low-side power transistor, $LS_{POWER}$, via the inductor 322-3.

Figure 4:
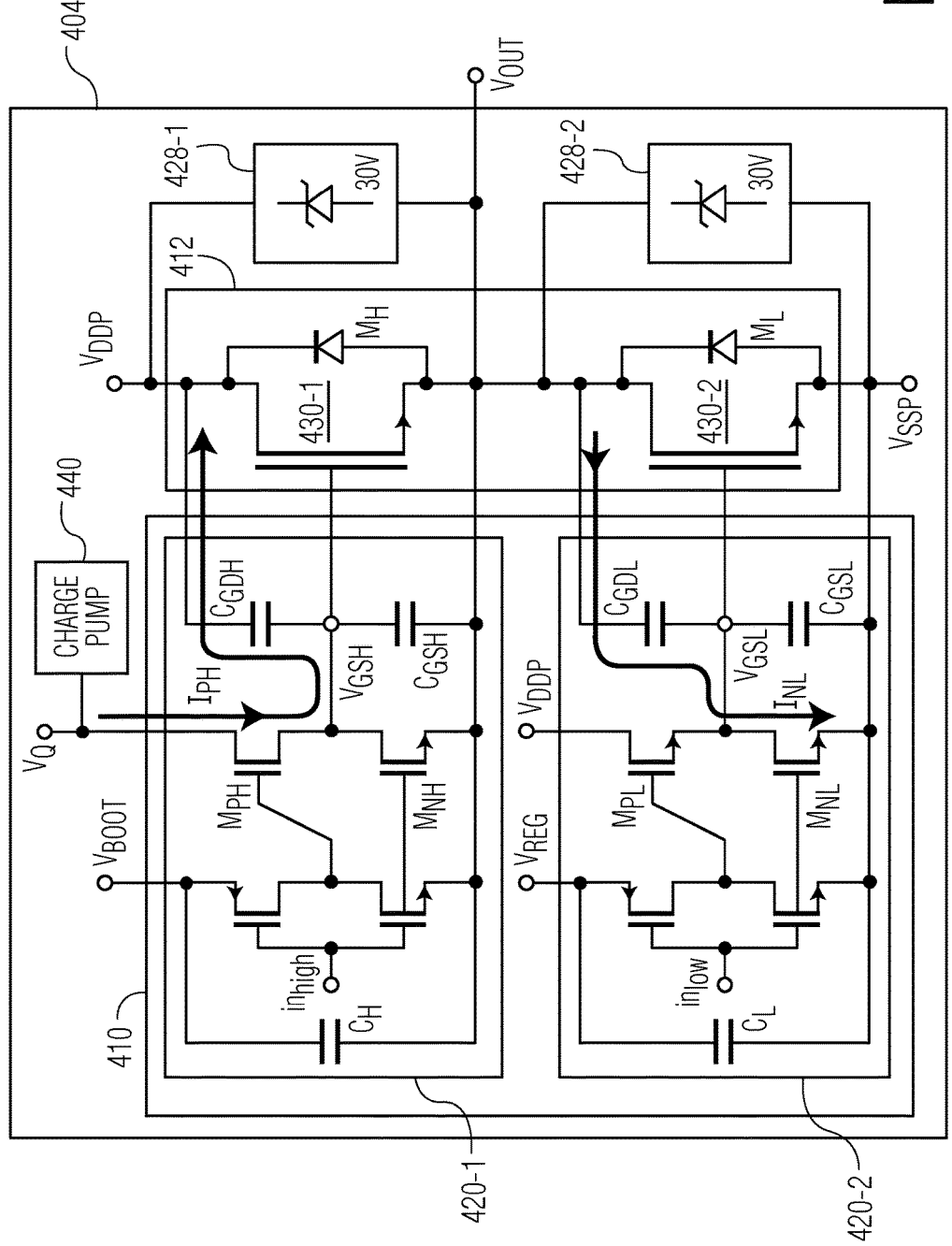
FIG. 4 depicts a typical power stage of a class-D amplifier that limits gate-source voltages of power transistors of the power stage using a charge pump.

FIG. 4 depicts a typical power stage 404 of a class-D amplifier that limits gate-source voltages of power transistors 430-1, 430-2 of the power stage using a charge pump 440. As shown in FIG. 4, the power stage includes the charge pump, a driver device 410 that includes a high-side driver circuit 420-1 and a low-side driver circuit 420-2, a switch circuit 412 that includes power transistors, "$HS_{POWER}$," "$LS_{POWER}$," and two diode circuits 428-1, 428-2. The large currents that are needed for charging the capacitors $C_{GSH}$, $C_{GDH}$, and the capacitors, $C_{GSL}$, $C_{GDL}$, are supplied from the charge pump and the supply voltage, $V_{DDP}$, respectively. The voltage, $V_{BOOT}$, is generated from the charge pump, 440. The voltages, $V_{BOOT}$, and $V_{REG}$, can limit the voltage, $V_{GSD}$, between the capacitors $C_{GSH}$, $C_{GDH}$, and the voltage, $V_{GSL}$ between the capacitors, $C_{GSL}$, $C_{GDL}$. Consequently, external bootstrapping is not needed, which avoids a high pin count in case multiple amplifier channels are used. A drawback of the power stage shown in FIG. 4 is that the gate-source voltage is limited to $V_{BOOT}-V_{GS\_MPH}$ (the gate-source voltage of the transistor, $M_{PH}$) and $V_{REG}-V_{GS\_MPL}$ (the gate-source voltage of the transistor, $M_{PL}$) unless the voltages, $V_{BOOT}$, and $V_{REG}$, are compensated by an additional compensation circuit.

Turning back to FIG. 2, compared to conventional driver devices (e.g., driver devices 210, 310), the driver circuit 220-1 or 220-2 may include a current multiplier 236-1 or 236-2, which is used to produce a larger output current for the power transistor. Consequently, the capacitance requirement for transistor components of the driver circuit can be relaxed and the component cost of the driver device can be reduced. Two detailed embodiments of the driver circuits 220-1, 220-2 depicted in FIG. 2 are described with reference to FIGS. 5 and 6.

Figure 5:
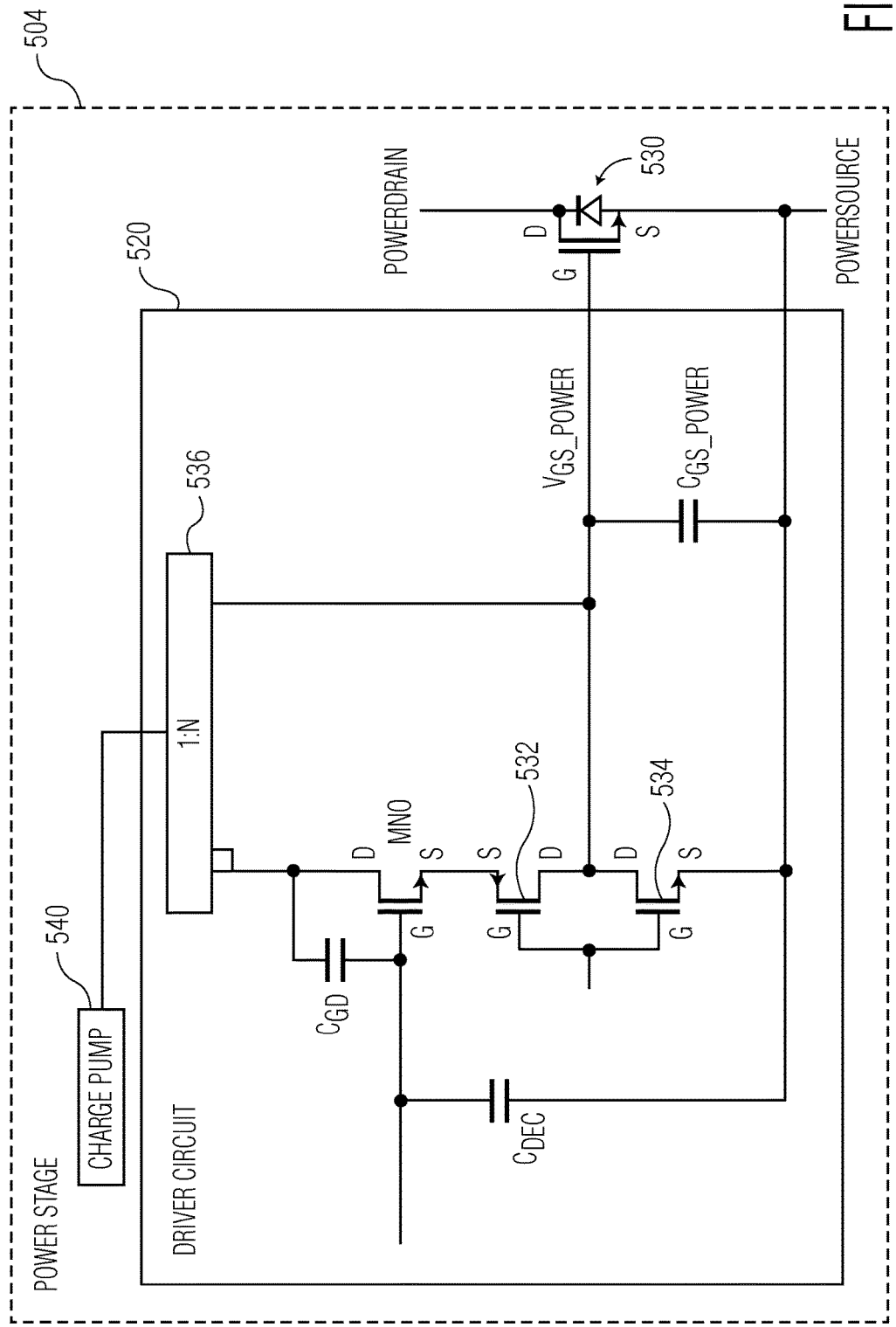
FIG. 5 depicts an embodiment of a driver circuit of the power stage depicted in FIG. 2.

FIG. 5 depicts an embodiment of one of the driver circuits 220-1, 220-2 depicted in FIG. 2. In the embodiment depicted in FIG. 5, a driver circuit 520 includes serially connected transistors, "MN0," 532, 534, a capacitor, "$C_{DEC}$," a current multiplier 536. Although the capacitor, $C_{DEC}$, is used in the embodiment depicted in FIG. 5, in other embodiments, other suitable voltage generator (e.g., a voltage source) can be used. The driver circuit can be used for both high-side and low-side power transistors of a power stage 504. The driver circuit depicted in FIG. 5 is one possible embodiment of the driver circuits depicted in FIG. 2. However, the driver circuits depicted in FIG. 2 are not limited to the embodiment shown in FIG. 5.

In the embodiment depicted in FIG. 5, an NMOS power transistor 530 of the power stage 504 has a parasitic capacitance, as represented by a capacitor, $C_{GS\_POWER}$, connected between the gate terminal, "G," of the NMOS power transistor and the source terminal, "S," of the NMOS power transistor 530. The drain terminals, "D," of the PMOS transistor 532 and the NMOS transistor 534 are connected to the gate terminal, G, of the NMOS power transistor 530. The capacitor, $C_{DEC}$, is connected between the gate terminal, G, of the NMOS transistor, MN0, and the source terminal, S, of the NMOS power transistor 530. The current multiplier 536 is connected between the gate terminal, G, of the NMOS power transistor 530 and the drain terminal, D, of the NMOS transistor, MN0, and to an optional charge pump 540 of the power stage, which generates a charge pump voltage. The current multiplier is configured to produce an output current that is proportional to the current at the drain terminal, D, of the NMOS transistor, MN0. In the embodiment depicted in FIG. 5, a ratio between the output current of the current multiplier and the current at the drain terminal, D, of the NMOS transistor, MN0, is N, which is a value that is larger than 1.

In the driver circuit 520 depicted in FIG. 5, the gate source voltage, $V_{GS\_POWER}$, of the NMOS power transistor 530 is limited to a fixed reference voltage. The capacitor, "$C_{DEC}$," supplies the gate charge current for the NMOS transistor, MN0. Typically, the parasitic gate-drain capacitance of the NMOS transistor, MN0, as represented by a capacitor, $C_{GD}$, is large because the gate charge current for the NMOS transistor, MN0, can be on the order of 100 mA while the gate-source voltage of the transistor, MN0 is limited due to the voltage headroom available. However, the gate-drain capacitor, $C_{GD}$, can cause high voltage spikes at the gate terminal, G, of the transistor, MN0. For example, when the driver circuit 520 is used for the high-side power transistor, the powerdrain voltage of the NMOS power transistor 530 is VDDP while the powersource voltage of the NMOS power transistor 530 is $PWM_{OUT}$. In this case, the voltage spikes/ripples, ΔV, at the gate terminal, G, of the NMOS transistor, MN0, can be expressed as:

$$\Delta V = (CP_{GD\_MN0}/CP_{DEC}) * VDDP \quad (1)$$

where $CP_{GD\_MN0}$ represents the capacitance of the gate-drain capacitor, $C_{GD}$, $CP_{DEC}$ represents the capacitance of the capacitor, $C_{DEC}$. For example, when $CP_{GD\_MN0}$ is 1 pF, VDDP is 14V, $CP_{DEC}$ is 20 pF, ΔV is 0.7 V. The voltage spikes/ripples, ΔV, of 0.7 V exceeds the typical voltage ripple tolerance of a high voltage transistor. Increasing the capacitance of the capacitor, $C_{DEC}$, can reduce the voltage spikes/ripples. However, increasing the capacitance of the capacitor, $C_{DEC}$, can also increase the dimensions and cost of the capacitor, $C_{DEC}$. In the driver circuit depicted in FIG. 5, the current multiplier 536 is used to reduce the requirements for the capacitances of the gate-drain capacitor, $C_{GD}$, and the gate-source capacitor, $C_{GS}$, of the NMOS transistor, MN0. For example, the capacitance requirements of the NMOS transistor, MN0 can be reduced by a factor of N, where N is a positive integer that is larger than 1. Consequently, the voltage spike at the gate terminal, G, of the NMOS transistor, MN0, is reduced.

Figure 6:
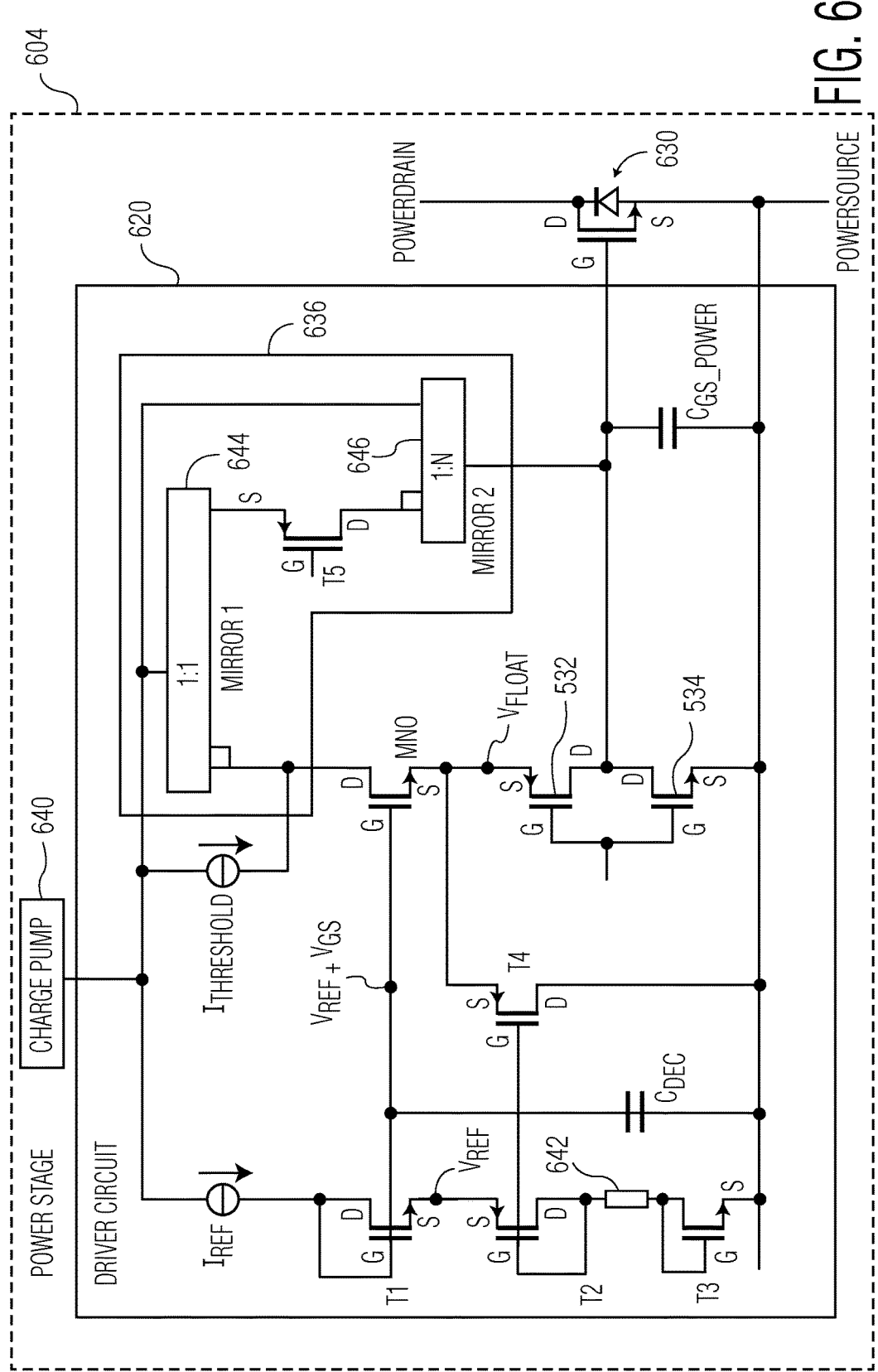
FIG. 6 depicts an embodiment of the driver circuit depicted in FIG. 5.

FIG. 6 depicts another embodiment of the driver circuit 210-1, 210-2 depicted in FIG. 2. In the embodiment depicted in FIG. 6, a driver circuit 620 includes serially connected transistors, MN0, "T1," "T2," "T3," "T4," 532, 534, the capacitor, $C_{DEC}$ (or other suitable voltage generating device), a current multiplier 636, two current sources, "$I_{REF}$," "$I_{THRESHOLD}$," and a resistor 642. The driver circuit can be used for both high-side and low-side power transistors of a power stage 604. The driver circuit depicted in FIG. 6 is one possible embodiment of the driver circuits depicted in FIG. 2. However, the driver circuits depicted in FIG. 2 are not limited to the embodiment shown in FIG. 6.

In the embodiment depicted in FIG. 6, the current source, $I_{THRESHOLD}$, is connected to the current multiplier 636 and to the drain terminal, D, of the transistor device, MN0. The current source, $I_{REF}$, is connected to the current multiplier, and an optional charge pump 640 of the power stage 604, which generates a charge pump voltage. The NMOS transistor, T1, has a gate terminal, G, connected to the gate terminal, G, of the NMOS transistor, MN0, and to the current source, $I_{REF}$. The PMOS transistor, T2, is serially connected to the NMOS transistor, T1. The resistor 642 is serially connected to the PMOS transistor, T2, and the NMOS transistor, T3. The PMOS transistor, T4, is connected to the gate terminal, G, of the PMOS transistor, T2, and to the source terminal, S, of an NMOS power transistor 630 of a power stage 604. The NMOS transistor, T3, is connected to the resistor and to the source terminal, S, of the NMOS power transistor 630. The current multiplier 636 includes a first current mirror 644 with an input current/output current ratio of 1:1, a second current mirror 646 with an input current/output current ratio of 1:N (N is a positive integer that is larger than 1), and a PMOS transistor, "T5."

In the driver circuit 620 depicted in FIG. 6, the current source, $I_{REF}$, creates a reference voltage, $V_{REF}$, across the transistor, T2, the resistor, 642, and the transistor, T3, with respect to the source terminal, S, of the NMOS power transistor 630. The reference voltage, $V_{REF}$, created by the current source, $I_{REF}$, is transferred to the transistors 532, 534, via the transistors, MN0, T4. Consequently, the maximum gate-source voltage, $V_{GS}$, of the NMOS power transistor 630 is limited to $V_{FLOAT}$, which is the voltage at the source terminals, S, of the transistors, MN0, 532, regardless of voltage spikes on the source terminal, S, of the NMOS power transistor 630. The current multiplier 636 creates a current amplification that allows a reduction in the size of the transistor, MN0. The DC current needed for the transistor, MN0, and the transistor, T4, is supplied by the current source, $I_{THRESHOLD}$, such that no current is forced into the gate terminal of the NMOS power transistor 630 when the NMOS power transistor 630 is turned off. The capacitance of the internal decoupling capacitor, $C_{DEC}$, can be set as a trade-off between the value of $I_{REF}$ (thus quiescent current) and circuit area. Compared to the driver circuits 320-1, 320-2 depicted in FIG. 3 and the driver circuits 420-1, 420-2 depicted in FIG. 4, the driver circuit 620 can be implemented with fewer components and, consequently, at a lower cost. For example, compared to the driver circuits depicted in FIG. 3, the driver circuit depicted in FIG. 6 does not require capacitors, such as capacitors, $C_{REG}$ and $C_{BOOTSTRAP}$.

Although specific embodiments of the invention that have been described or depicted include several components described or depicted herein, other embodiments of the invention may include fewer or more components to implement less or more features.

In addition, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A driver circuit for a power stage of a class-D amplifier, the driver circuit comprising:
   serially connected transistor devices connected to a gate terminal of a power transistor of the power stage of the class-D amplifier;
   a voltage generator connected between a gate terminal of a first transistor device of the serially connected transistor devices and a source terminal of the power transistor;
   a current multiplier connected between the gate terminal of the power transistor and one of a source terminal and a drain terminal of the first transistor device, wherein the current multiplier is configured to produce an output current that is proportional to a current at the one of the source terminal and the drain terminal of the first transistor device; and
   wherein the current multiplier comprises a plurality of current mirrors.

2. The driver circuit of claim 1, wherein a ratio between the output current of the current multiplier and the current at the one of the source terminal and the drain terminal of the first transistor device is a value that is larger than 1.

3. The driver circuit of claim 1, wherein the serially connected transistor devices further comprise a second transistor device with one of a source terminal or a drain terminal connected to the gate terminal of the power transistor.

4. The driver circuit of claim 3, wherein the serially connected transistor devices further comprise a third transistor device connected between the gate terminal of the power transistor and the source terminal of the power transistor.

5. The driver circuit of claim 4, wherein gate terminals of the second and third transistor devices are connected to each other.

6. The driver circuit of claim 4, wherein the second and third transistor devices are transistors of different types.

7. The driver circuit of claim 4, further comprising a first current source connected to the current multiplier and to the one of the source terminal and the drain terminal of the first transistor device.

8. The driver circuit of claim 7, further comprising a second current source connected to the current multiplier and a fourth transistor device with a gate terminal connected to a gate terminal of the first transistor device and to the second current source.

9. The driver circuit of claim 8, further comprising:
a fifth transistor device serially connected to the fourth transistor device;
a resistor serially connected to the fifth transistor device;
a sixth transistor device connected to a gate terminal of the fifth transistor device and to the source terminal of the power transistor; and
a seventh transistor device connected to the resistor device and to the source terminal of the power transistor.

10. The driver circuit of claim 1, wherein the power transistor is an NMOS transistor, and wherein the source terminal of the power transistor is a source terminal of the NMOS transistor.

11. The driver circuit of claim 1, wherein the first transistor device is an NMOS transistor, and wherein the one of the source terminal and the drain terminal of the first transistor device is a drain terminal of the NMOS transistor.

12. The class-D amplifier comprising the driver circuit and the power stage of claim 1.

13. The class-D amplifier of claim 12, further comprising a modulator configured to convert an input signal into a modulated signal for the power stage.

14. A driver circuit for a power stage of a class-D amplifier, the driver circuit comprising:
serially connected transistor devices connected to a gate terminal of an NMOS power transistor of the power stage;
a voltage generator connected between a gate terminal of a first NMOS transistor device of the serially connected transistor devices and a source terminal of the NMOS power transistor;
a current multiplier connected between the gate terminal of the NMOS power transistor and a drain terminal of the first NMOS transistor device, wherein the current multiplier is configured to produce an output current that is proportional to a current at the drain terminal of the first NMOS transistor device; and
wherein the current multiplier comprises a plurality of current mirrors.

15. The driver circuit of claim 14, wherein a ratio between the output current of the current multiplier and the current at the one of the source terminal and the drain terminal of the first transistor device is a value that is larger than 1.

16. The driver circuit of claim 14, wherein the serially connected transistor devices further comprise:
a PMOS transistor device with a drain terminal connected to the gate terminal of the NMOS power transistor; and
a second NMOS transistor device, wherein the drain terminals of the PMOS transistor device and the second NMOS transistor devices are connected to the gate terminal of the NMOS power transistor.

17. A driver circuit for a power stage of a class-D amplifier, the driver circuit comprising:
serially connected transistor devices connected to a gate terminal of a power transistor of the power stage of the class-D amplifier;
a voltage generator connected between a gate terminal of a first transistor device of the serially connected transistor devices and a source terminal of the power transistor;
a current multiplier connected between the gate terminal of the power transistor and one of a source terminal and a drain terminal of the first transistor device, wherein the current multiplier is configured to produce an output current that is proportional to a current at the one of the source terminal and the drain terminal of the first transistor device;
wherein the serially connected transistor devices further comprise a second transistor device with one of a source terminal or a drain terminal connected to the gate terminal of the power transistor; and
wherein the serially connected transistor devices further comprise a third transistor device connected between the gate terminal of the power transistor and the source terminal of the power transistor.

* * * * *